United States Patent [19]

Tran et al.

[11] Patent Number: 5,642,316
[45] Date of Patent: Jun. 24, 1997

[54] METHOD AND APPARATUS OF REDUNDANCY FOR NON-VOLATILE MEMORY INTEGRATED CIRCUITS

[75] Inventors: Hieu Van Tran, San Jose, Calif.; Trevor Blyth, Sandy, Utah

[73] Assignee: Information Storage Devices, Inc., San Jose, Calif.

[21] Appl. No.: 653,073

[22] Filed: May 21, 1996

[51] Int. Cl.$^6$ ................ G11C 7/00; G11C 8/00; G11C 11/34

[52] U.S. Cl. ............... 365/200; 365/189.07; 365/225.7; 365/230.06; 365/185.09

[58] Field of Search .................. 365/200, 225.7, 365/189.07, 230.06, 185.09

[56] References Cited

U.S. PATENT DOCUMENTS

| | | | |
|---|---|---|---|
| 4,538,245 | 8/1985 | Smarandoiu et al. | 365/200 |
| 4,546,454 | 10/1985 | Gupta et al. | 365/200 |
| 4,617,651 | 10/1986 | Ip et al. | 365/200 |

*Primary Examiner*—David C. Nelms
*Assistant Examiner*—Trong Quang Phan
*Attorney, Agent, or Firm*—Blakely, Sokoloff, Taylor & Zafman LLP

[57] ABSTRACT

A redundancy circuit used in a non-volatile memory chip to increase the production yield due to manufacturing defects. The redundancy circuit includes a redundancy predecoder circuit, a source follower EEPROM (electrically erasable programmable read only memory) memory fuse, a scheme to use the column high voltage drivers (also known as page latch) to program the EEPROM fuses, a scheme to use the regular row decoder (also known as wordline driver or x-decoder) as the redundancy row decoder, and an out-of-bound address as a redundancy enable/disable signal.

23 Claims, 5 Drawing Sheets

METHOD AND APPARATUS OF REDUNDANCY FOR NON-VOLATILE MEMORY INTEGRATED CIRCUITS

BACKGROUND OF THE INVENTION

1. Field of the Invention

The present invention relates to the field of integrated circuit design, specifically to redundancy circuits used to increase the production yield of non-volatile memory integrated circuits.

2. Prior Art

Particle defects due to fabrication environments can cause non-volatile memory integrated circuits, especially those with high density memory arrays, to fail. As a result, a yield loss in final production test is realized, causing the final satisfactory product to cost substantially more so as to cover the cost of the faulty parts. To help increase the yield, a technique commonly known as redundancy repair (row, column, or block), is used to avoid use of the failed memory portion in favor of a corresponding redundant memory portion included on the integrated circuit just for such purposes, should it be needed.

Redundancy circuits typically store the addresses of the failed memory portion in some form of storage, and in use, compare the incoming addresses versus the stored redundancy addresses for a match. If a match is found, the redundancy array is enabled and the main array is disabled. An enable fuse is typically included to enable or disable the redundancy addresses. Some conventional implementations use a resistor fuse as a programmable element to store the failed addresses. The fuse is blown by applying a high current through the fuse by a test enabling circuit. Such a fuse is one-time programmable only. Since the current required to blow the fuse is normally high, the transfer switch has to be large, and requires a corresponding large chip area.

Other implementations use EPROM technology (erasable programmable read-only memory). However, as implemented, an EPROM fuse is also one-time programmable. Further, an EPROM requires complicated shielding over the fuse after programming in order to retain the programming charge. Other implementations use EEPROM (electrically erasable programmable read only memory) in an inverter mode (as commonly known), i.e., the cell in the read mode acts as a current sink for some loading elements such as a PMOS, NMOS, or a resistor. The device gate is typically held at 2 V and its source at ground, with its drain coupled to the load. The voltage at the loading element is the output of the memory cell.

Prior art implementations for a memory cell row repair normally include a separate redundancy row decoder and an enable/disable fuse for each redundancy row. Prior art implementations for the row repair also normally include a redundancy row decoder which is different from the regular row decoder. Further, prior art implementations also require a separate high voltage decoder for programming each fuse element. All these require additional circuits and added complexity to achieve the desired result.

In prior art U.S. Pat. No. 4,617,651 by W. Ip and G. Perlegos and U.S. Pat. No. 4,538,245 by G. Smarandolu and G. Perlegos, a redundancy disable/enable circuit is required for each redundant row. In the present invention, out-of-bound addressing is used to self enable a redundant row, thereby eliminating the need for a redundant disable/enable circuit. Moreover, in both the '651 and '245 patents, the redundancy element is a one time programmable fuse. However, the EEPROM fuse in the present invention enables the redundancy to be programmable many times and eliminates the need for high current devices required to burn the one time programmable fuse. Finally, in the '651 and '245 patents, a separate redundancy programming circuit is required whereas in the present invention, the programming circuit is shared with the normal programming circuit through the use of column switches.

SUMMARY OF THE INVENTION

The present invention includes a redundancy predecoder circuit, a source follower EEPROM memory fuse, a scheme to use the column high voltage drivers (also known as page latch) to program the EEPROM fuses, a scheme to use the regular row decoder (also known as wordline decoder or x-decoder) as the redundancy row decoder, and an out-of-bounds address for the fuses as a redundant enable/disable signal.

The redundancy predecoder circuit is used to adapt the regular row predecoder for use with the redundancy row decoder to minimize the additional circuits required to implement the redundancy. The regular column high voltage drivers are used to program the EEPROM fuses to minimize the need for additional high voltage drivers for the redundancy circuits. A high voltage test signal is enabled during manufacturing to enable the transfer switches between the regular column drivers and the EEPROM fuses, and can be used to disable the main row decoders in order to avoid programming the regular memory cells. Moreover, since the main row decoder and the redundancy row decoder are identical, the layout of the two match exactly, and no additional effort is required for the layout of redundancy row decoders.

The EEPROM fuses are initially set at an out-of-bound address (that is, higher than the maximum address of the main array) so that the redundancy rows are initially "disabled" by not being within the normally used address range. Additionally, any redundancy row can also be disabled by programming an out-of-bound address into the corresponding EEPROM fuse. Note that the maximum number of addresses that can be addressed by the address inputs is larger than the address space required by the main memory array. By reserving a certain number or block of addresses to be "invalid" addresses not usually input to the device, the redundant address fuses can be initialized to one of the unused addresses and redundancy is not invoked until the fuse is programmed with a "valid" address. Thus, the redundancy scheme does not require separate circuits to enable or disable redundant rows, but instead is enabled automatically when fuses are programmed with the address of a faulty row.

The EEPROM fuse is a source follower type memory cell used with a MOS differential comparator. The source follower EEPROM cell in the read mode has its gate and its source coupled to a regulated voltage and its drain connected to a current bias which is connected to ground. The drain voltage is the output of the memory cell.

DETAILED DESCRIPTION OF THE PRESENT INVENTION

An apparatus and method for a redundancy circuit used in a non-volatile memory chip to increase the production yield due to manufacturing defects is described in detail. The description will assume that the memory is an analog non-volatile memory of the type used in analog recording and playback devices manufactured and sold by Information Storage Devices (ISD), Inc. of San Jose, Calif. as that is the intended application of the preferred embodiment. However, the invention may equally as well be used in other storage systems such as digital storage systems. An analog non-volatile memory cell can typically store a single sample of an analog signal with a resolution of approximately one part in 250. For an audio application with 60 seconds of storage capacity, the array size will be 60 seconds divided by the inverse of the audio sampling rate (8 KHz is typical, giving a sample every 125 μsec), or 60 seconds/125 μsec=480K cells. The 480K array in the preferred embodiment is divided into 1200 columns and 400 rows.

Figure 1:
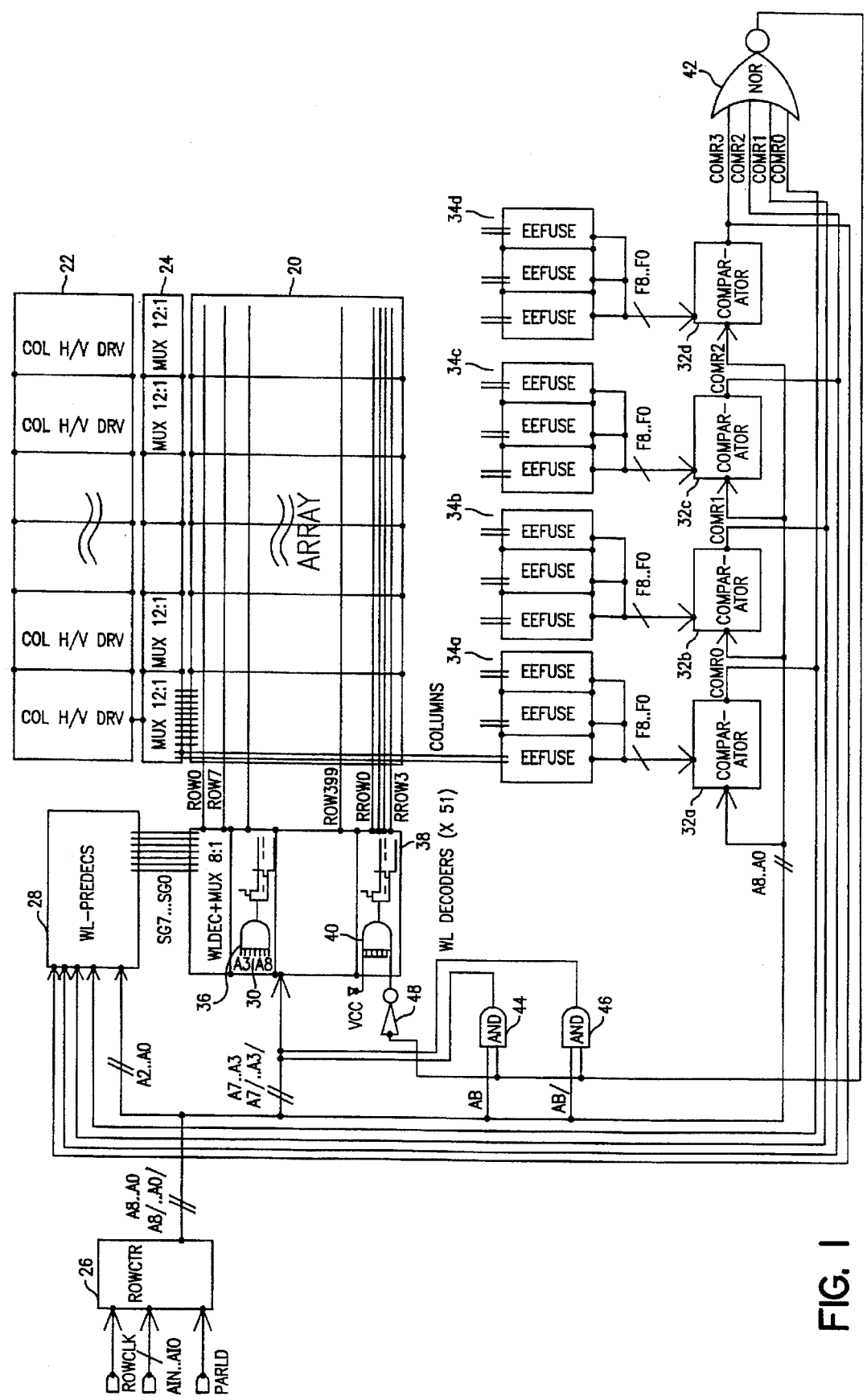
FIG. 1 is a block diagram for the preferred embodiment of the redundancy circuit of the present invention.

Now referring to FIG. 1, a block diagram of a preferred embodiment of the present invention may be seen. FIG. 1 includes a main memory 20, in this embodiment comprising a main array of the 400 rows of memory cells labeled ROW0 through ROW399, and a redundancy array below the main array comprised of 4 rows of memory cells labeled RROW0 through RROW3, providing a total array of 404 identical rows of memory cells. Each row of the array is divided into 12 scans, each scan being equal to 12.5 ms of recording and playback, or for 8 KHz, 100 cells. For all 12 scans, this represents 150 ms of recording and playback. In this particular implementation, 150 ms is chosen to be the audio time resolution, in that recording and playback of any signal or message will be of a time equal to an integer multiple of 150 ms increments, regardless of when within the last 150 ms the signal or message terminated. Thus the whole row can be programmed or read back in 12 scans, the incrementing from one scan to the next being automatic. Thus addressing is only required from row to row, the column addressing being automatically advanced scan to scan. Since the column drivers must drive 100 cells at a time, 100 column drivers 22 are used, each operating through a 12:1 MUX 24 to controllably connect the 100 column drivers to a respective 100 columns of the 1200 columns for each of the respective 12 groups of 100 columns each (e.g. for each of the 12 scans per row).

Also shown in FIG. 1 is the row counter 26, the word line or row predecoders 28, the row decoders 30, four comparators 32 and four sets of EEPROM cells forming EEPROM fuses 34a, 34b, 34c and 34d (referred to collectively as "fuses 34"). The EEPROM fuses are located directly below the main array to facilitate the connection from the regular columns to the EEPROM fuses. The row counter 26 operates from a row clock ROWCLK to sequence through the rows by way of a 9 bit address A8..A0 and its inverse A8/..A0/, though can also receive a parallel input AIN..AI0 and an input strobe signal PARLD to initially point the counter to any row of the array. The word line predecoders 28 decode the least significant three bits A2..A0 of the address to activate 1 of 8 select gate lines SG7..SG0. The remaining 6 bits of the address A8/..A3 are decoded by appropriate choice of connection of address lines and their inverses to 50 NAND gates 36. The NAND gates combined with an 8:1 MUX minimize the circuits so they can fit into the height dimension (pitch) of the cell. The redundancy row decoder 38 is the same as a regular row decoder except that all but one of the inputs to the NAND gate 40 of the redundancy row decoder 38 are tied to VCC, so that that one input may itself control the output of the NAND gate. The redundancy row decoding is realized using the regular row predecoder signals SG0 through SG3 with the addition of control signals COMR0–COMR3 from the comparators 32, together with certain control logic hereinafter described in greater detail.

In general, except as altered by the present invention as described herein, the row counter 26, and the combination of the word line predecoders 28 and the word line or row decoders 30, function as in the prior art ISD devices, and as described in various issued patents, including U.S. Pat. No. 5,241,494. Similarly, the output circuits, much of the control of the analog storage device, and certain other aspects of the device are not shown in FIG. 1 for clarity, as these are also known from prior art ISD devices and issued patents, and their inclusion herein would unnecessarily obscure the present invention. (See U.S. Pat. No. 4,890,259 for a general overview of this type of device.)

Initially after fabrication, the analog storage device is tested to determine if any storage cells in the main array and redundant array are bad (nonfunctional, usually by a storage cell providing a fixed output at one voltage extreme independent of its programming, though it is possible more than one cell in a row or an entire row will be nonfunctional for some reason). If a storage cell in the main array is determined to be bad, the entire row of cells will be dropped from use in favor of one of the 4 rows of redundant cells, as subsequently described in greater detail. Typically, testing to determine the number of bad rows, if any, would be done at wafer sort to avoid packaging costs for the integrated circuits which are faulty in ways that cannot be repaired by use of the redundant rows. Then programming the fuses to cut out faulty rows would typically be done after packaging to be sure no further loss was incurred by packaging.

Once the device has been tested after packaging and the location of the bad cells has been identified by row address (in the embodiment disclosed the bad cells must not effect more than 4 rows, the number of redundant storage cell rows provided), the bad address EEPROM fuses 34 may be programmed. Each bad row address is a 9 bit address, so that 9 EEPROM fuses are required for each address, or 36 EEPROM fuses total are needed to implement the 4 redundant rows. As shall be subsequently seen, each EEPROM fuse in the preferred embodiment uses two EEPROM cells which are independently programmed to operate differentially. Consequently, there are 72 EEPROM cells to program to set the four 9-bit bad address EEPROM fuses.

At the start of the programming cycle for the bad address EEPROM cells, a test mode is entered by way of the test enable signal, TESTHV, which will connect the columns to the fuses. This signal can also be used to disable the cell decode circuits 36 of the main array, though in the specific embodiment disclosed, the main array is effectively disabled by simply using an address that is out of the main array address range. The column drivers 22 are serially loaded with ones or zeros depending on the desired programmed or erased state of a cell coupled to each driver. Since there are 100 line drivers, each EEPROM cell of the four 9-bit bad address EEPROM fuses may be coupled to a respective line driver for a particular scan, in which case all four redundancy row addresses are programmed using the same scan.

Alternatively, each 18 EEPROM cells of a respective 9-bit bad address EEPROM fuse may be coupled to a different scan (different setting of the 12:1 MUXs 24) so that each 9-bit bad address EEPROM fuse is programmed on a separate scan. The choice of either of these or some other coupling is a matter of design choice and chip layout, not important to the subject of this disclosure.

The loaded data corresponds to the failed row addresses. A high voltage, e.g. 21 V, is applied to all column drivers to start the programming cycle. The high voltage is such as supplied from a standard charge pump. The same high voltage is also applied to other required circuits, such as row decoders and row predecoders. For each scan, the first scan write cycle of 12.5 ms includes 1.25 ms allocated for the erase cycle and 11.25 ms allocated for the write cycle. The signal TESTHV is asserted to couple the EEPROM cells of the fuses to the array columns. Also an out of range address (above the address range for the 400 rows of the main memory array, the maximum number of possible rows being addressable from addresses A0–A8 being 512) is asserted on address lines A8..A0 so that none of the rows of the main memory array are addressed. Thus during an erase cycle for redundancy fuses, only the EEPROM cells of the fuses are erased. Then the erase cycle is disabled and the write cycle is enabled for the remainder of the scan. During the write cycle, only EEPROM cells of the fuses are programmed, specifically by each of the column drivers outputting either a high voltage or zero depending on the desired state of the respective EEPROM cell of the fuse.

The 12:1 MUX may be serially enabled by the scan rate of 12.5 ms so that the process is repeated for the 12 scans, though as stated before, in the exemplary embodiment, all fuses can be programmed in a single scan if coupled to the columns of the same scan during the programming. Consequently the serial enabling of the 12 scans could be eliminated if desired. Also, the fuses are initially loaded with all is at the time of fabrication in a manner to be described, so as to automatically contain an out of main memory range address.

With respect to the addressing during programming and normal analog recording and playback device operation, at least for rows of main memory array cells with no faults, the output of NOR gate 42 will be high. Consequently the output of AND gates 44 and 46 will be the same as the second inputs thereto, namely the states of address A8 and A8/, so that the presence of the AND gates in these two address lines will be of no effect.

Once the fuses are programmed as described, then in normal operation of the analog storage device, comparators 32 constantly compare the 9 bit faulty row address stored in the fuses with the address on address lines A8..A0. When addressing a faulty row of main memory is attempted, one of the comparators will detect an address comparison and provide a high output signal. Thus one of the inputs COMR3..COMR0 to NOR gate 42 will go high, driving the output of the NOR gate low. Therefore, one of the inputs of the AND gates 44 and 46 will go low, forcing the output of the AND gates low regardless of the state of A8 and A8/. Now at least one input of all 50 NAND gates 36 will be low, holding the output of all 50 NAND gates high, which as shall subsequently be seen in detail, invalidates the address to every row of the main array, effectively disabling the addressing of any row of the main memory array.

The output of the NOR gate 42 is also coupled to the inverter 48, so that when the output of the NOR gate goes low upon a comparator detecting a comparison, the output of the inverter 48 will go high, so that now all inputs of the NAND gate 40 are high, enabling the addressing of the redundant rows RROW3..RROW0. The addressing of the one of four redundant rows is done by the predecoders 28 responding to the output of the comparator finding an address match to assert a corresponding one of signals SG3..SG0. Thus when a faulty row of the main memory array is addressed, whether during recording or playback, the corresponding redundant row is addressed instead, all in a manner transparent to other parts of the integrated circuit system and the outside world.

Figure 2:
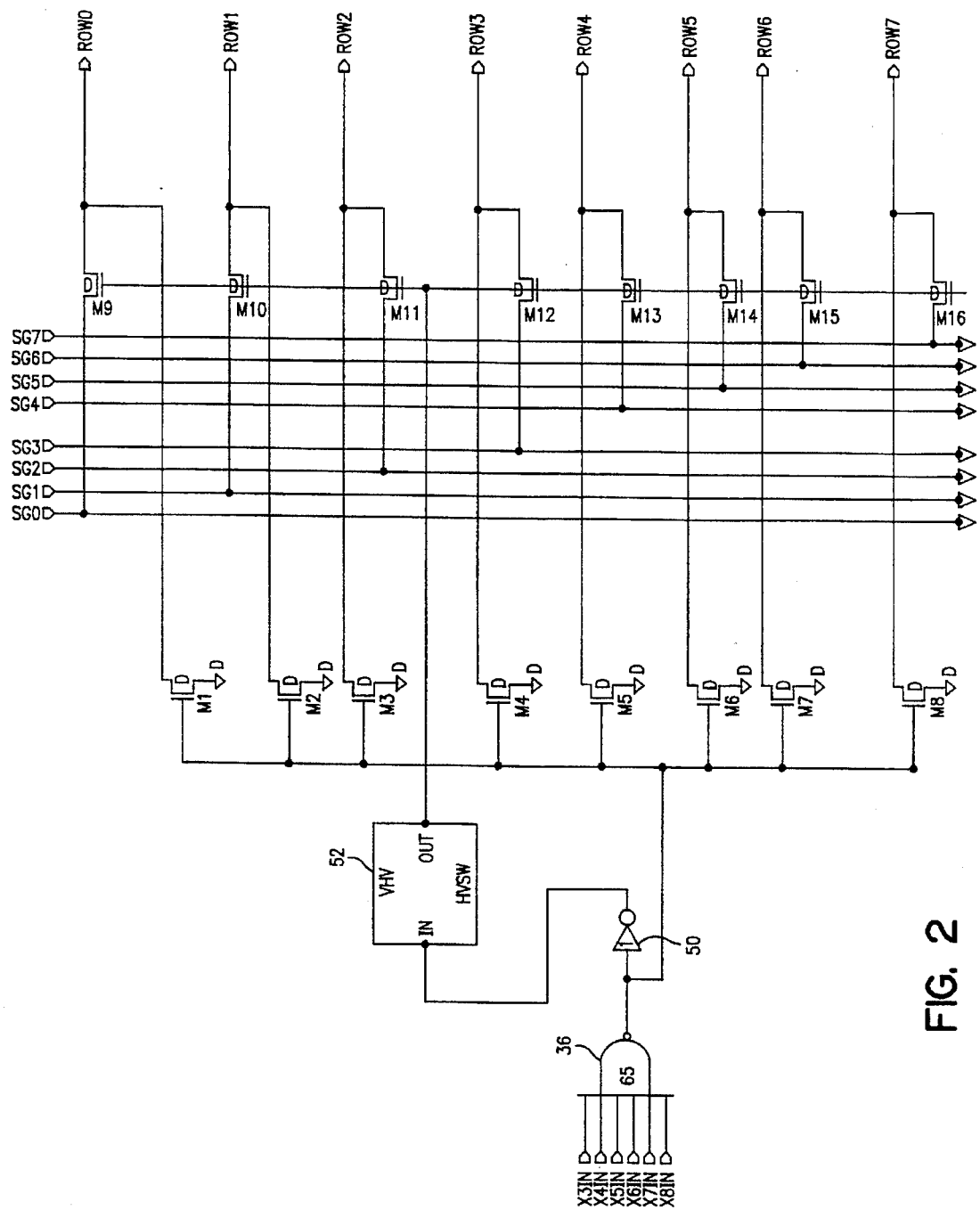
FIG. 2 is a circuit diagram of the row decoders of FIG. 1.

FIG. 2 is a circuit diagram for a typical row decoder 30 of FIG. 1. The inputs to the row decoders are SG0..SG7, and as X8IN..X3IN, unique combinations of the address signals A3..A8 and their inverses A3/..A8/. The row addresses are input to the NAND gate for straight binary decoding from 1 to 50, together with the 8 inputs from the predecoder, thereby decoding a total of 8 times 50 or 400 rows. The NAND gate 36 for each decoder receives a different combination of 6 address signals A8..A3 and their inverse A8/..A3/so that one and only one NAND gate will have all inputs high at the same time. Thus normally the output of a NAND gate 36 will be high. This holds high voltage switch 52 off through inverter 50, holding n-channel devices M9 through M16 off. (The high voltage switch could be implemented using a clocked high voltage or a high voltage level shifter as is well known in the art.) The high output of NAND gate 36 also turns on N-channel devices M1 through M8, coupling all eight rows controlled by that decoder low.

When the specific combination of the 6 address signals A8..A3 and their inverse A8/..A3/ for that row decoder are all high at the same time, the output of a NAND gate 36 will go low. This turns off N-channel devices M1 through M8, and turns on high voltage switch 52 through inverter 50. The output of the high voltage switch could be the high voltage in programming mode, VCC or some intermediate level in read mode (or zero when not selected). The high voltage output of the switch turns on n-channel devices M9 through M16 to couple each of ROW0 through ROW7 to a respective row predecoded signal SG0 to SG7. Since only one of the lines SG0 to SG7 will have a high voltage on it at any one time, only one row of the seven rows is driven high.

Figure 3:
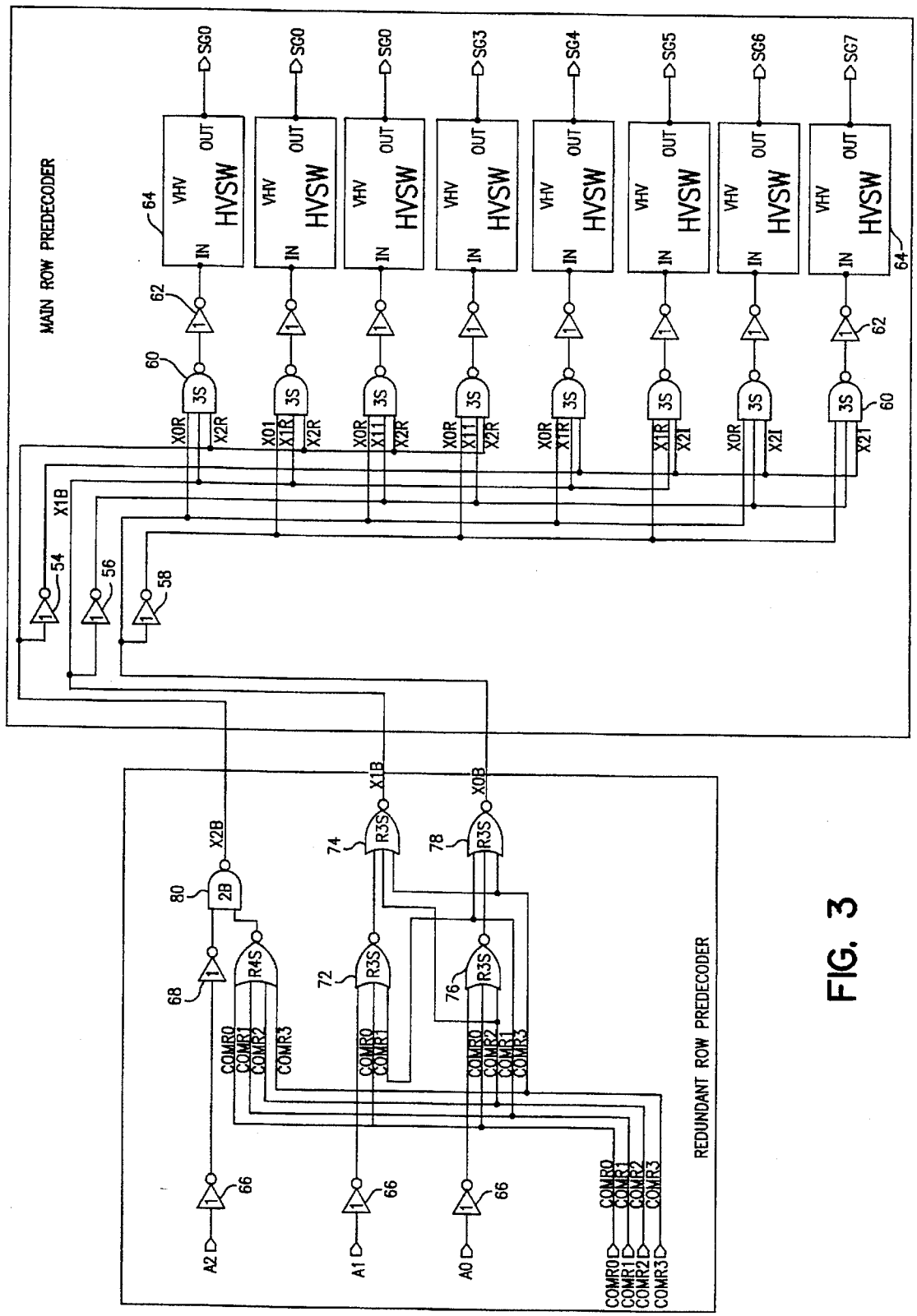
FIG. 3 is a circuit diagram of the row predecoders of FIG. 1.

FIG. 3 is a circuit diagram for a row predecoder circuit 28 of FIG. 1. The row predecoder circuit comprises two circuits: the MAIN ROW PREDECODER and the REDUNDANT ROW PREDECODER. Referring first to the redundant row predecoder of FIG. 3, inverters 66 serve to invert the input address signals A2, A1 and A0, with inverter 68 reinverting the A2 signal. NOR gates 70, 72, 74, 76 and 78 and NAND gate 80 serve to decode the redundant rows using comparator outputs COMR0 through COMR3. Note that since only one row address (A8..A0) is active at any given time, no more than one comparator output COMR0 through COMR3 can be active at any given time (usually none are active for most, if not all addresses). For example, if none of the comparator outputs COMR0 through COMR3 are active (high), the output of NOR gate 70 will be high, so that the output of NAND gate 80, X2B, will be the inverse of the signal on the A2 address input line. Also the outputs of the NOR gates 72 and 76 will be the inverse of the outputs of the inverters 66 on the A1 and A0 lines, with the outputs of NOR gates 74 and 78 being the inverse of the outputs of NOR gates 72 and 76. Consequently, if none of the comparator outputs COMR0 through COMR3 are active, the outputs of gates 80, 74 and 78 are X2B, X1B and X0B, the inverse of the signals on the address lines A2, A1 and A0, respectively.

When one of the comparators finds an address comparison, its output will go high. If COMR0 is high and COMR1,2,3 are low, the output of NOR gate 70 will be low, causing X2B, the output of NAND gate 80 to be high. The output of NOR gate 72 will also be low, and since COMR2,3 are low, the output of NOR gate 74, X1B, will be high. The output of NOR gate 76 will also be low, and since COMR1,3 are low, the output of NOR gate 78, XOB, will be high. Consequently, X2B,X1B,XOB=111, regardless of the signals on the address lines A2–A0.

If COMR1 is high and COMR0,2,3 are low, the output of NOR gate 70 will be low, causing the output of NAND gate 80, X2B, to be high. The output of NOR gate 72 also is also low, and since COMR2,3 are low, the output of NOR gate 74, X1B, is high. Further, since COMR1 is high, the output of NOR gate 78, XOB, equal low. Thus, X2B,X1B,XOB= 110, regardless of the signals on the address lines A2–A0.

Continuing to refer to FIG. 3, if COMR2 is high and COMR0,1,3 are low, the output of NOR gate 70 will be low, which causes the output of NAND gate 80 to be high. Further, since COMR2 is high, the output of NOR gate 74, X1B, to be low. Also the output of NOR gate 76 will be low, and since COMR1,3 are low, the output of NOR gate 78, XOB, will be high. Thus, X2B,X1B,XOB=101, regardless of the signals on the address lines A2–A0. Finally, if COMR3 is high and COMR0,1,2 are low, the output of NOR gate 70 will be low, which causes the output of NAND gate 80 to be high. Also since COMR3 is high, the output of NOR gate 74, X1B, will be low and the output of NOR gate 78, XOB, will be low. Thus, X2B,X1B,XOB=100, regardless of the signals on the address lines A2–A0. The row predecoder circuit of FIG. 3 serves as an example of four redundant rows only. However, in another embodiment, more or fewer redundant rows can be used Referring now to the main row predecoder of FIG. 3, inverters 54, 56, and 58 serve to invert the input signals to the main row decoder X2B, X1B, and XOB, to provide the signals X2I, X1I, and X0I respectively, with NAND gates 60 and inverters 62 providing straight binary decoding for the 3 inputs. The inputs to the main row prodecoder X2B–XOB are the inverse of the signals on the address lines A2–A0 respectively, when no redundancy is used (i.e. when COMR3..COMR0 are all low). The 3-input NAND gates 60 and inverters 62 are connected to decode from 1 to 8 using address lines A2..A0 when redundancy is not used. For example if A2,A1,A0=000, SG0 is high and SG1..SG7 are all low; if A2,A1,A0=011, SG3 is high and SG0..SG2 and SG4..SG7 are all low, etc. Thus during the use of the redundancy, if COMR0 is high, X2B,X1B,XOB=111, so that SG0 is high. If COMR1 is high, X2B,X1B,XOB=110, so that SG1 is high. If COMR2 is high, X2B,X1B,XOB=101, so that SG2 is high, and finally, if COMR3 is high, X2B, X1B,XOB=100, so that SG3 is high, all independent of the signals on the address lines A2–A0. The high voltage switches 64 (HVSW) are conventional high voltage switches, such as clocked high voltage switches or level shifters, as are well known in the art.

Figure 4B:
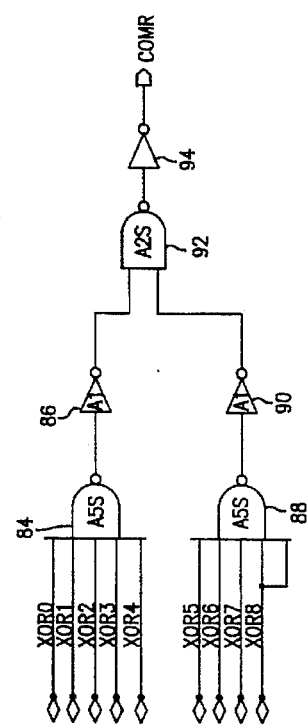
FIG. 4 consisting of FIGS. 4a and 4b is a circuit diagram of a typical comparator circuit of FIG. 1.
Figure 4A:
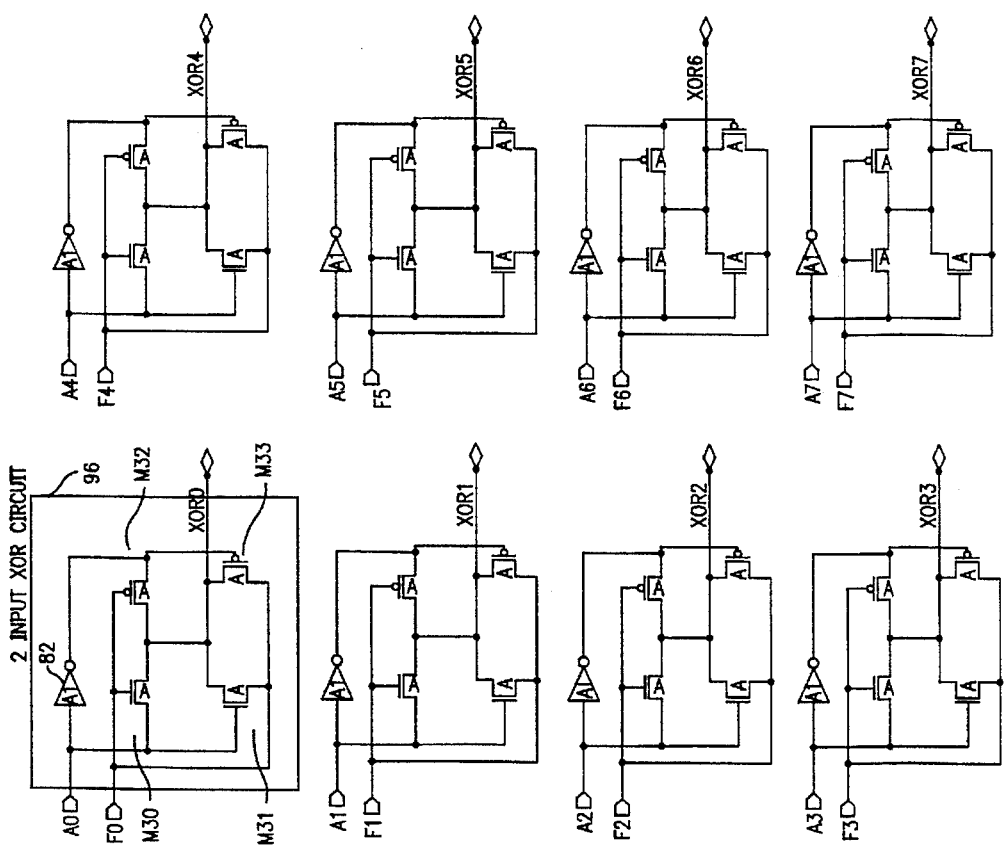

FIGS. 4a and 4b illustrate a typical comparator circuit 32 (see FIG. 1) of the present invention. The circuit of FIG. 4a, 9 of which are used in each comparator of the exemplary embodiment disclosed, serves to compare the incoming addresses on address lines A8..A0 with the respective stored redundancy addresses F8..F0 of a respective fuse 34 (see FIG. 1), bit by bit, for a match. If they are the same, all inputs to the circuit of FIG. 4b will be high, so that the output COMR is high. Otherwise the output COMR will be low.

The basic bit comparator of FIG. 4a for each of the 9 address bits A8..A0 and a respective one of the fuse bits F8..F0 is a typical 2 input XOR (exclusive OR) circuit 96. Using XOR circuit 96 as an typical bit comparator, XOR circuit 96 includes an inverter 82, n-channel devices M30 and M31, and p-channel devices M32 and M33. The inputs to XOR circuit 96 is A0 and F0. The output of XOR circuit 96 is high if the inputs A0 and F0 are the same, and low if the inputs are different. For example, if A0 and F0 are both zero, devices M30, M31 and M33 are off and device M32 is on. The output of inverter 82 will be high to turn on device M32, thereby coupling the high output of the inverter to the output XOR0.

Again using XOR circuit 96 as a typical bit comparator, if A0 and F0 are both one, device M33 will be turned on through inverter 82, coupling the high state of F0 to the output XOR0. Devices M30, M31, and M32 will be off. If A0 is low and F0 is high, devices M31, M32, and M33 are off and device M30 is on. Therefore, device M30 couples the low input A0 to the output XOR0. Finally, if A0 is high and F0 is low, devices M30, M32, and M33 are off and device M31 is on. As a result, the low input F0 is coupled to the output XOR0. As can be seen in FIG. 4b, outputs XOR0–XOR4 and XOR5–XOR8 are coupled as the inputs to NAND gates 84 and 88 respectively, the outputs of which are inverted by inverters 86 and 90 respectively. The outputs of inverters 86 and 90 form the inputs to NAND gate 92, the output of which is inverted by inverter 94 to provide the output COMR. This connection of NAND gates 84, 88, 92 and inverters 86, 90, and 94 provide the logical equivalent of a single, 9 input AND gate for ANDing the outputs of the 9 XOR (exclusive or) circuits of FIG. 4a.

Figure 5:
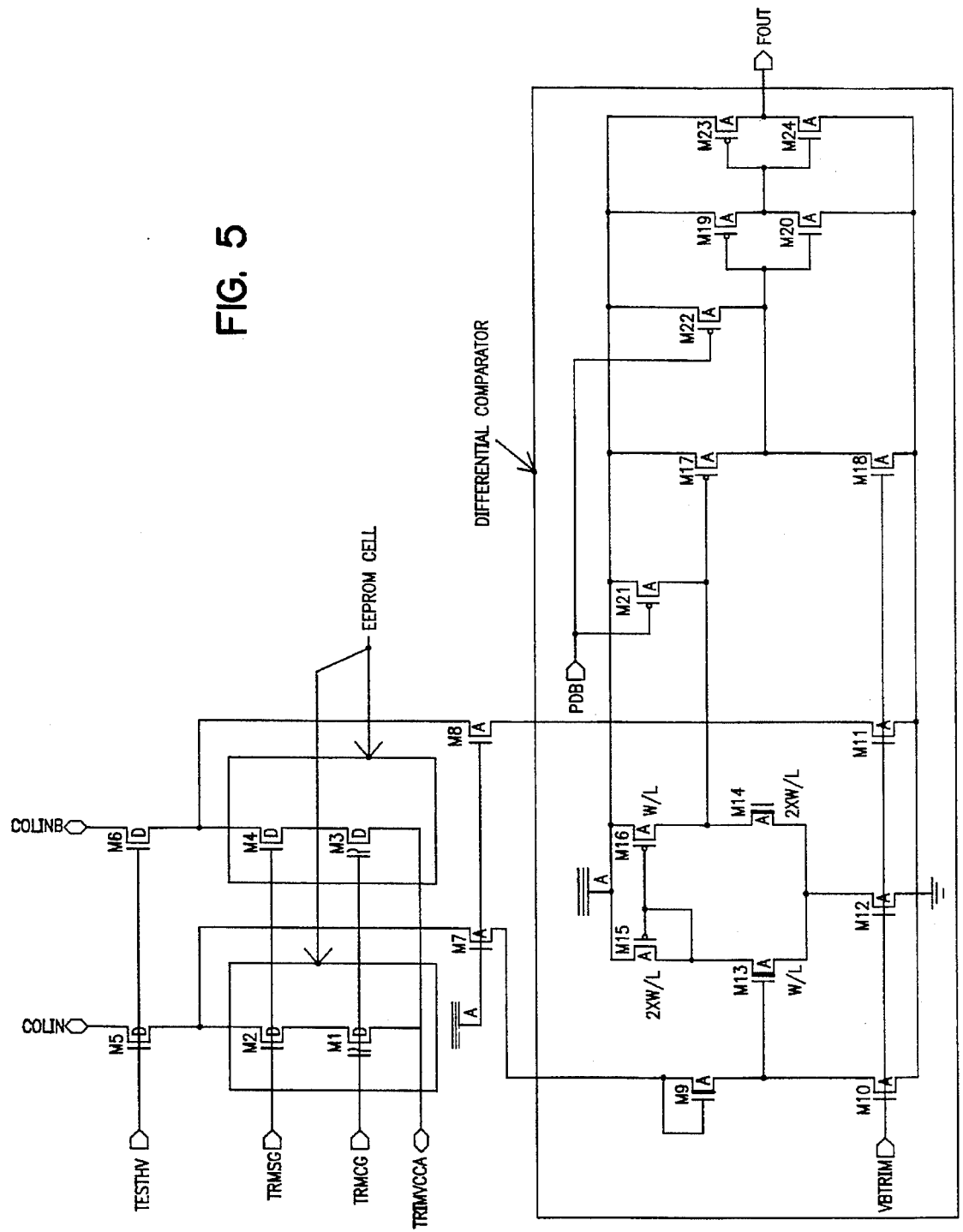
FIG. 5 is a circuit diagram of an EEPROM fuse of FIG. 1.

FIG. 5 is a circuit drawing for a typical EEPROM fuse circuit of the present invention. The EEPROM fuse circuit includes two EEPROM cells which serve as fuse elements. High voltage n-channel devices M5 and M6 are gated by the test signal TESTHV which connects the two main array columns COLIN and COLINB to the fuses for programming purposes. The circuit also includes a weighted MOS differential comparator (amplifier) for sensing the state of the EEPROM cells. n-channel devices M7 and M8 serve to isolate the sensing circuit from the high voltage when the fuses are in the programming mode. Therefore, the drains of devices M7 and M8 are high voltage drains (such as lightly doped or double diffused junction). Devices M1, M2, M3 and M4 are typical two transistor EEPROM cell devices. M5 and M6 are high voltage n-channel devices (such as double diffused source and drain NMOS devices) for transmitting the high voltage from the column high voltage drivers to the EEPROM cells during erase and write cycles. Device M9 serves to skew the inputs to the differential amplifier to predetermine the initial output FOUT, as the fuses are in the same initial states when first out of fabrication.

Device M9 is a native n-channel device (threshold voltage≈0 V). As a result, the voltage drop from the EEPROM cell is minimized to allow the differential pair to work better at low input voltage levels. n-channel devices M10 and M11 are utilized to bias the fuses as in a source follower read configuration. Devices M12–20 constitute a typical MOS differential amplifier, with devices M19, M20, M23, and M24 providing a rail to rail output. p-channel devices M21 and M22 force the output FOUT to one in power down mode. Also, the size of device M15 is twice that of device M16, and the size of device M14 is twice that of device M13 to further initially skew the comparator. Devices M13 and M14 are native NMOS transistors (threshold voltage≈0 V) to also make the input differential pair work better at low input voltage levels.

For programming the EEPROM cells of FIG. 5, TESTHV will be driven to a high voltage by some typical high voltage enable test circuit in order to pass the high voltage from the regular columns COLIN and COLINB to the fuses. The data loaded to the column drivers depends on the desired programmed state of the fuses, which typically corresponds to the failed row addresses. All four row addresses are typically loaded at the same time, though not necessarily during the same scan. The trim data for other programmable circuits on the chip, such as an oscillator and voltage references can also be loaded at the same time. For the unused redundancy fuses, the data should be set at an out-of-bounds address (higher than row 400, i.e., such as all ones) in order to disable the redundancy rows.

The data for one pair of cells of one fuse will be complementary. TRMSG will be enabled to high voltage by some typical high voltage enable circuit. During an erase cycle, the signal TRMCG (gates of devices M1 and M3) will be driven to a high voltage while all columns are grounded by tying TRIMVCCA to ground. This is the condition for a typical EEPROM CELL erase. The cell threshold voltage will be about 6 V. During a write cycle, TRMSG is still kept at a high voltage, TRMCG is set to zero, and TRIMVCCA is allowed to float at approximately 5 V. This is the condition for the typical EEPROM CELL write. In the write cycle, the cell threshold voltage will be about −0.5 V. As one memory cell of one fuse is programmed, the other cell of the same fuse is left erased by the respective column driver being held low.

During a read operation, TESTHV is held low. TRMSG is set to VCC or some intermediate level such as 10 V, TRMCG is set to 3.5 V, and TRIMVCCA is also set to 3.5 V, such as by a typical operational amplifier regulator. n-channel devices M10 and M11 are then turned on to provide bias currents for the source follower EEPROM cells. As the silicon comes out of fabrication, the threshold voltage of the cells is about 1.2 V equally. Device M9 will cause the gate of device M13 to see a VT (threshold voltage) lower than the gate of device H14. Device M14 is also twice as large as device M13, so device M14 turns on heavily to pull down the gate of device M17. Device M15 is twice as large as device M16 so the current mirrored from device M15 is only half as much, which causes the gate of device M17 to fall even further. Device M17 turns on hard to pull its drain to VCC, which in turn pulls the drain of device M20 to ground. As a result, device M23 turns on and pulls the output FOUT to VCC.

If device M1 is erased and device M3 is programmed, device M1 will be off and the gate of device M13 is pulled low by device M10. Device M3 is on so its drain voltage, which is approximately 3.5 V-ΔV (from bias current) =≈3 V. Device M8 passes 3 V to the gate of device M14. Since device M13 is off completely, the current in device M12 pulls the gate of device M17 all the way to ground. This turns on device M17, pulling its drain high, which after two inversions by the inverters formed by devices M19, M20, M23 and M24, forces output FOUT to VCC or high. Conversely, as device M1 is programmed and device M3 is erased, device M3 will be off and the gate of device M14 is pulled to ground by device M11. Device M1 is on so its drain voltage, approximately 3 V, passes by device M7 to the gate of device M9 and the gate of device M13 thus sees 3 V-VT (M9)=≈2 V. Since device M14 is off completely, device M16 will pull the gate of device M17 to VCC, turning off device M17 so that the current in device M18 will pull the drain of device M18 low, forcing the output FOUT to zero.

Therefore, any desired state, either one or zero, can be programmed into the fuse by loading appropriate patterns in the column drivers during programming. The initial states of the fuses on fabrication are forced to one so that the fuse address equivalences, i.e., F8–F0 are out-of-bound addresses of the main array. This causes the comparator outputs COMR0–COMR3 of FIG. 1 to be zero which disables the redundancy row decoders and the redundancy rows. If redundancy is not used, any address pattern above the maximum row address (400 in the present invention) of the main array can be programmed into the fuses to disable the redundancy row decoders.

The present invention has been described with respect to a preferred embodiment, specifically one configured for the storage and playback of analog samples of an analog signal. However the invention is also applicable to systems configured for the storage of digital signals, either in the usual one bit (two states) per storage cell, or in a multilevel storage format providing more than two distinct levels representing more than one digital bit per storage cell. Such multilevel digital storage systems would use a digital to analog converter to convert the input digital signals to a respective one of the multiple analog levels, wherein the levels are sufficiently separated in voltage from each other to remain distinct and unambiguous throughout prolonged storage, over the operating temperature range, repeated reprogramming of other cells on the same integrated circuit, after repeated readback and conversion back to digital form by an analog to digital converter, etc. For instance, one might store N bits of digital information per storage cell by using $2^N$ distinct storage levels per cell, where N is, for example, 3 or 4. Alternatively, one could use three cells to store the equivalent of eight bits by storing any of eight distinct levels in two of the three cells and storing any of four distinct levels in the third cell.

Thus, while the preferred embodiment of the present invention has been disclosed and described herein, it will be understood by those skilled in the arts that various changes in form and detail may be made therein without departing from the spirit and scope thereof.

What is claimed is:

1. A semiconductor memory addressable by an address within a first address range comprising:
   an array of memory cells having a plurality of rows and columns, the array being divided into primary and redundant arrays of memory cells, the redundant array having at least one row of cells, the semiconductor memory being subject to the possibility of at least one faulty row of memory cells in the primary array;
   a plurality of row decoders divided into primary row decoders and at least one redundant row decoder, the primary row decoders coupled to a plurality of address lines with each decoder coupled to at least a respective one of the plurality of rows, the primary array being addressable over a second address range within and less than the first address range;
   a plurality of fuse elements forming at least one group of fuse elements and being controllably coupleable to the plurality of columns for programming of each group with an address of a faulty row in the primary array; and
   at least one comparator, each comparator being coupled to a respective group of fuse elements and to the plurality of address lines to compare the address in the plurality of fuse elements and the address on the plurality of address lines, the comparator enabling a redundant row decoder and disabling the primary row decoder associated with the faulty row if the address on the plurality of address lines is the same as the address in the plurality of fuse elements.

2. The semiconductor memory of claim 1 wherein each group of fuse elements, when not programmed with an address of a faulty row in the primary array, is programed with an address within the first address range and not within the second address range.

3. The semiconductor memory of claim 1 wherein each of the plurality of row decoders are identical.

4. The semiconductor memory of claim 1 wherein the plurality of row decoders comprises a plurality of primary row decoders and one redundant row decoder.

5. The semiconductor memory of claim 4 further comprised of row predecoders shared by the plurality of primary row decoders and the one redundant row decoder, the redundant array having a plurality of rows of cells, the fuse elements forming a plurality of groups and the semiconductor memory having a plurality of comparators, the plurality of groups and the plurality of comparators being equal in number to the plurality of rows of cells in the redundant array, the output of each comparator being coupled to the predecoder to force the predecoder output to address a respective row of the redundant array upon the occurrence of the respective comparison.

6. The semiconductor memory of claim 1 wherein each of the plurality of fuse elements includes a pair of reprogrammable fuses in the form of electrically erasable programmable read only memory devices.

7. The semiconductor memory of claim 1 wherein each of the plurality of fuse elements includes a pair of reprogrammable fuses in the form of electrically erasable programmable read only memory devices connected to be read in a source follower mode.

8. The semiconductor memory of claim 7 wherein each of the plurality of fuse elements includes differential fuse output circuitry for providing a fuse output responsive to the differential in programming between the pair of reprogrammable fuses.

9. A semiconductor memory addressable by an address within a first address range comprising:
   an array of memory cells having a plurality of rows and columns, the array being divided into primary and redundant arrays of memory cells, the redundant array having at least one row of cells;
   a plurality of row decoders divided into primary row decoders and at least one redundant row decoder, the primary row decoders coupled to a plurality of address lines and each decoder coupled to at least a respective one of the plurality of rows, the primary array being addressable over a second address range within and less than the first address range;
   a plurality of fuse elements forming at least one group of fuse elements for programing of each group with an address of a faulty row in the primary array
   at least one comparator, each comparator being coupled to a respective group of fuse elements and to the plurality of address lines, the comparator enabling a redundant row decoder and disabling the primary row decoder associated with the faulty row if the address on the plurality of address lines is the same as the address in the plurality of fuse elements.

10. The semiconductor memory of claim 9 wherein each group of fuse elements, when not programmed with an address of a faulty row in the primary array, is programmed with an address within the first address range and not within the second address range.

11. The semiconductor memory of claim 9 wherein each of the plurality of row decoders are identical.

12. The semiconductor memory of claim 9 wherein the plurality of row decoders comprises a plurality of primary row decoders and one redundant row decoder.

13. The semiconductor memory of claim 12 further comprised of row predecoders shared by the plurality of primary row decoders and the one redundant row decoder, the redundant array having a plurality of rows of cells, the fuse elements forming a plurality of groups and the semiconductor memory having a plurality of comparators, the plurality of groups and the plurality of comparators being equal in number to the plurality of rows of cells in the redundant array, the output of each comparator being coupled to the predecoder to force the predecoder output to address a respective row of the redundant array upon the occurrence of the respective comparison.

14. The semiconductor memory of claim 9 wherein each of the plurality of fuse elements includes a pair of reprogrammable fuses in the form of electrically erasable programmable read only memory devices.

15. The semiconductor memory of claim 9 wherein each of the plurality of fuse elements includes a pair of reprogrammable fuses in the form of electrically erasable programmable read only memory devices connected to be read in a source follower mode.

16. The semiconductor memory of claim 15 wherein each of the plurality of fuse elements includes differential fuse output circuitry for providing a fuse output responsive to the differential in programming between the pair of reprogrammable fuses.

17. A method of providing redundancy in a semiconductor memory addressable through a plurality of address lines by an address within a first address range comprising the steps of:
   providing an array of memory cells having a plurality of rows and columns, the array being divided into primary and redundant arrays of memory cells, the redundant array having at least one row of cells, the primary array being addressable over a second address range within and less than the first address range;
   providing a plurality of fuse elements forming at least one group of fuse elements and programming at least one group with an address of a respective faulty row in the primary array;
   comparing the address in each group of fuse elements with the address on the address lines; and,
   enabling a redundant row decoder and disabling the primary row decoder associated with the faulty row when the address in a group of fuse elements matches the address on the address lines.

18. The method of claim 17 wherein each group of fuse elements, when not programmed with an address of a faulty row in the primary array, is programmed with an address within the first address range and not within the second address range.

19. The method of claim 18 wherein each of the fuse elements is a pair of electrically erasable programmable read only memory devices.

20. The method of claim 17 wherein the semiconductor memory is a memory for storing more than two discrete voltage levels representing a digital signal of more than one bit.

21. The method of claim 17 wherein the semiconductor memory is a memory for storing $2^N$ discrete voltage levels representing a digital signal of N bits, where N is greater than 1.

22. A semiconductor memory addressable by a present address within a first address range comprising:

array means having a plurality of rows and columns, the array means being divided into primary and redundant arrays, the primary array being addressable over a second address range within and less than the first address range;

decoder means divided into primary row decoders and at least one redundant row decoder coupled to a respective one of the plurality of rows;

storage means coupleable to the plurality of columns for programming with an address of a faulty row in the primary array; and comparator means coupled to the storage means for enabling a redundant row decoder and disabling the primary row decoder associated with the faulty row if an address in the storage means is equal to the present address.

23. The semiconductor memory of claim 22 wherein the storage means, when not programmed with an address of a faulty row in the primary array, is programmed with an address within the first address range and not within the second address range.